(12) United States Patent
Kobayashi et al.

(10) Patent No.: US 6,454,966 B1
(45) Date of Patent: Sep. 24, 2002

(54) FLUORESCENT CONVERSION FILTER AND ORGANIC LIGHT EMITTING ELEMENT INCLUDING THE SAME

(75) Inventors: Ryoji Kobayashi; Yotaro Shiraishi; Koji Kawaguchi, all of Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/633,630

(22) Filed: Aug. 7, 2000

(30) Foreign Application Priority Data

Aug. 5, 1999 (JP) .......................................... 11-222203

(51) Int. Cl.$^7$ .......................... C09K 11/06; H05B 33/14
(52) U.S. Cl. ............................ 252/301.35; 252/301.36; 313/501; 428/690
(58) Field of Search ..................... 313/501; 252/301.35, 252/301.36; 428/690

(56) References Cited

U.S. PATENT DOCUMENTS 6,137,459 A  * 10/2000 Eida et al. ..................... 345/76

FOREIGN PATENT DOCUMENTS

JP           9-245511          9/1997

* cited by examiner

*Primary Examiner*—C. Melissa Koslow
(74) *Attorney, Agent, or Firm*—Rossi & Associates

(57) ABSTRACT

A fluorescent conversion filter converts the light in the region between near-ultraviolet and blue to green light and emits the green light with a high color purity, and to provide an organic light emitting element including such a fluorescent conversion filter. The fluorescent conversion filter contains, in a matrix resin, a fluorescent converter material, selected from a fluorescent dye, a fluorescent pigment and a mixture of a fluorescent dye and a fluorescent pigment, that absorbs light in the wavelength region between near-ultraviolet and blue and emits green light, and a light absorbing dye. The fluorescent converter material, that has an absorption band in the wavelength region between 450 and 500 nm, is contained in the fluorescent conversion filter at a mixing ratio, at that the light absorbance of the fluorescent conversion filter is one or more in the wavelength region between 450 and 500 nm. The light absorbing dye, that has an absorption band in the more than 550 nm wavelength region, is contained in the fluorescent conversion filter at a mixing ratio, at that the light absorbance of the fluorescent conversion filter is 0.1 or more in the wavelength region between 550 and 650 nm. By transmitting the light from an organic light emitter in the wavelength region between 450 and 520 mn through the fluorescent conversion filter according to the invention, green light with a high color purity is obtained. A fluorescent conversion film containing a fluorescent converter material and a light absorption film containing a light absorbing dye may be laminated to form a laminate fluorescent conversion filter.

24 Claims, 5 Drawing Sheets

··· (II – 1)

··· (III – 1)

FLUORESCENT CONVERSION FILTER AND ORGANIC LIGHT EMITTING ELEMENT INCLUDING THE SAME

FIELD OF THE INVENTION

The present invention relates to a fluorescent conversion filter that converts the light in the region between near-ultraviolet and blue to green light and an organic light emitting element including such a fluorescent conversion filter. The fluorescent conversion filter and the organic light emitting element are used preferably in display devices for civil or industrial use such as a light-emitting-type multi-color display, a light-emitting-type full-color display, a display panel and a back light.

BACKGROUND

Research and development of various light emitting elements have been vigorously explored to meet the increasing demands for flat panel displays for replacing conventional Brownian tubes. The electroluminescent element (hereinafter simply referred to as a "light emitting element") is an all-solid-state self-light-emitting element that meets the above described demands. The electroluminescent element has attracted much attention due to its very high resolution and very high visibility, which other display devices do not exhibit.

To provide a flat panel display with a multicolor display function or a full-color display function, light emitters of the three primary colors, i.e. red-light emitters, blue-light emitters and green-light emitters, are separately arranged in a matrix and the light emitters are controlled to emit light in the respective colors (cf. Japanese Unexamined Laid Open Patent Applications No. S57-157487, No. S58-147989 and No. H03-214593). It is technically difficult and expensive to use an organic light emitting element for a color display, since three kinds of light emitting materials for the three primary colors must be arranged very finely in a matrix. In addition, since the lives of the three different light emitting materials are not identical, chromaticity deviations are caused with elapse of time.

The three primary colors are obtained by transmitting the white light from a back light through color filters (cf. Japanese Unexamined Laid Open Patent Applications No. H01-315988, No. H02-273496 and No. H03-194895). White light with high luminance is necessary to obtain the three primary colors at high luminance. However, any long-life organic light emitting element that emits white light at high luminance has not been obtained so far.

Japanese Unexamined Laid Open Patent Application No. H03-152897 discloses a planar and separate arrangement of fluorescent converter materials, which absorb the light from a light emitter and emit polychromatic fluorescent light. The planar and separate arrangement of fluorescent converter materials for emitting polychromatic fluorescent light is applied to the CRT's and the plasma displays.

Japanese Unexamined Laid Open Patent Applications No. H03-152897 and H05-258860 disclose a color conversion method that uses fluorescent converter materials, which absorb the light from an organic light emitting element and emit fluorescent light in the visible wavelength region. Since the color of the light that the organic light emitting element emits is not limited to white, an organic light emitting element that emits light at higher luminance may be used as a light source. Japanese Unexamined Laid Open Patent Applications No. H03-152897, No. H08-286033 and No.H09-208944 disclose a color conversion method that uses an organic blue-light emitting element as a light source and converts the blue light to green light and red light by respective fluorescent dyes. By finely patterning the fluorescent conversion films, each including one of those fluorescent dyes, a full-color light-emitting type display may be constructed even when a weak energy ray such as a near-ultraviolet ray and a visible ray from a light emitter is used.

The fluorescent conversion filter is patterned, in the similar manner as the inorganic fluorescent converter, by dispersing a fluorescent dye into liquid photoresist (photo-reactive polymer), forming a film of the dispersion liquid by spin coating and by patterning the formed film by the photolithographic technique (cf. Japanese Unexamined Laid Open Patent Applications No. H05-198921 and No. H05-258860). The fluorescent conversion filter is patterned also by dispersing a fluorescent dye or a fluorescent pigment into a basic binder and by etching the basic binder film with acidic aqueous solution (cf. Japanese Unexamined Laid Open Patent Application No. H09-208944).

The conventional light emitting display, based on the color conversion method that uses an organic blue-light-emitting element, fails to always obtain green light with a high color purity, since more than 10% of the light from the blue-light-emitting element is transmitted through the color conversion filter. In addition, the color purity is also impaired since fluorescent dye contained in the color filter emits light with the wavelength region of 550 nm and longer.

To obtain green light with a high color purity, a green color filter is laminated on the light emitting side of the fluorescent conversion filter. However, the green color filter impairs the color conversion efficiency, since the green color filter absorbs the light in the wavelength region between 500 and 550 nm.

In view of the foregoing, it is an object of the invention to provide a fluorescent conversion filter that converts the light in the region between near-ultraviolet and blue to green light and emits the green light with a high color purity. It is another object of the invention to provide an organic light emitting element including such a fluorescent conversion filter.

SUMMARY OF THE INVENTION

According to an aspect of the invention, there is provided a fluorescent conversion filter including: a fluorescent converter material selected from the group consisting of a fluorescent dye, a fluorescent pigment, and a mixture of a fluorescent dye and a fluorescent pigment; a light absorbing dye; and a matrix resin; the fluorescent converter material absorbing the light from a light emitter, the light being in a wavelength region between near-ultraviolet and blue; the fluorescent converter material emitting green light; the fluorescent converter material having an absorption band in a wavelength region between 450 and 500 nm; the fluorescent converter material being contained in the fluorescent conversion filter at a mixing ratio, at that the light absorbance of the fluorescent conversion filter is one or more in the wavelength region between 450 and 500 nm; the light absorbing dye having an absorption band in a wavelength region of 550 nm or longer; the light absorbing dye being contained in the fluorescent conversion filter at a mixing ratio, at that the light absorbance of the fluorescent conversion filter is 0.1 or more in a wavelength region between 550 and 650 nm.

According to an aspect of the invention, there is provided a fluorescent conversion filter including: a fluorescent conversion film; and a light absorption film laminated on the fluorescent conversion film; the fluorescent conversion film including a matrix resin and a fluorescent converter material selected from the group consisting of a fluorescent dye, a fluorescent pigment and a mixture of a fluorescent dye and a fluorescent pigment; the fluorescent converter material absorbing the light from a light emitter, the light being in a wavelength region between near-ultraviolet and blue; the fluorescent converter material emitting green light; the fluorescent converter material having an absorption band in a wavelength region between 450 and 500 nm; the fluorescent converter material being contained in the fluorescent conversion film at a mixing ratio, at that the light absorbance of the fluorescent conversion filter is 1 or more in the wavelength region between 450 and 500 nm; the light absorption film including a light absorbing dye and the matrix resin; the light absorbing dye having an absorption band in a wavelength region of 550 nm or longer; the light absorbing dye being contained in the light absorption film at a mixing ratio, at that the light absorbance of the fluorescent conversion filter is 0.1 or more in a wavelength region between 550 and 650 nm.

Advantageously, the light absorbing dye is an oxazine dye described in FIG. 4 by a general formula (I), where $R_1$ is a hydrogen atom, an alkyl group, an aryl group or a heterocyclic group; $R_2$ is a hydrogen atom, an alkyl group, an aryl group or a heterocyclic group; $R_3$ is a hydrogen atom, an alkyl group, an aryl group or a heterocyclic group; $R_4$ is a hydrogen atom, an alkyl group, an aryl group or a heterocyclic group; $R_1$, $R_2$, $R_3$ and $R_4$ are same with or different from each other; $R_5$ is a hydrogen atom or a benzene ring; $R_6$ is a hydrogen atom or a benzene ring; and X is an anion selected from the group consisting of $I^-$, $Br^-$, $ClO_4^-$, $BF_4^-$, $PF_4^-$, and $SbF_4^-$.

Advantageously, the light absorbing dye is a cyanine dye described in FIG. 5 by a general formula (II), where $R_1$ is a hydrogen atom, an alkyl group, an aryl group or a heterocyclic group; $R_2$ is a hydrogen atom, an alkyl group, an aryl group or a heterocyclic group; $R_3$ is a hydrogen atom, an alkyl group, an aryl group or a heterocyclic group; $R_4$ is a hydrogen atom, an alkyl group, an aryl group or a heterocyclic group; $R_5$ is a hydrogen atom, an alkyl group, an aryl group or a heterocyclic group; $R_6$ is a hydrogen atom, an alkyl group, an aryl group or a heterocyclic group; $R_1$, $R_2$, $R_3$, $R_4$, $R_5$ and $R_6$ are same with or different from each other; and $X^-$ is an anion selected from the group consisting of $I^-$, $Br^-$, $ClO_4^-$, $BF_4^-$, $PF_4^-$, $SbF_4^-$, and $1/2(SO_4^{2-})$.

Advantageously, the light absorbing dye is a cyanine dye described in FIG. 6 by a general formula (III), where $R_1$ is a hydrogen atom, an alkyl group, an aryl group or a heterocyclic group; $R_2$ is a hydrogen atom, an alkyl group, an aryl group or a heterocyclic group; $R_1$, and $R_2$ are same with or different from each other; and $X^-$ is an anion selected from the group consisting of $I^-$, $Br^-$, $ClO_4^-$, $BF_4^-$, $PF_4^-$, $SbF_4^-$, and $1/2(SO_4^{2-})$.

Advantageously, the matrix resin is a photo-curing resin.

Advantageously, the matrix resin is a photo- and thermo-setting resin.

According to still another aspect of the invention, there is provided an organic light emitting element including any of the fluorescent conversion filters described above and an organic light emitter that emits light in a wavelength region between 450 and 520 nm.

Since the fluorescent converter material, having an absorption band in the wavelength region between 450 and 500 nm, is contained in the fluorescent conversion filter or in the fluorescent conversion film at a mixing ratio, at that the light absorbance of the fluorescent conversion filter is 1 or more in the wavelength region between 450 and 500 nm, the light from the light emitter is prevented from leakage in the wavelength region between 450 and 500 nm.

Since the light absorbing dye, having an absorption band in the wavelength region of more than 550 nm, is contained in the fluorescent conversion filter or in the light absorption film at a mixing ratio, at that the light absorbance of the fluorescent conversion filter is 0.1 or more in the wavelength region between 550 and 650 nm, the light with a wavelength of 550 nm or longer is interrupted.

The fluorescent conversion filter according to the invention, that emits and transmits light in the wavelength region between 500 and 550 nm selectively, facilitates outputting green light with a high color purity. The monolayered fluorescent conversion filter including a layer that contains a fluorescent converter material and a light absorbing dye, facilitates simplifying the manufacturing process, since it is not necessary to dispose an individual light absorption film.

The photo-curing resin or the photo- and thermo-setting resin used for a matrix resin facilitates very fine patterning by the conventional photolithographic techniques.

The organic light emitting element according to the invention, that outputs the light from the organic light emitter through the fluorescent conversion filter described above, efficiently emits green light with a high color purity.

BRIEF DESCRIPTION OF THE DRAWING FIGURES

Figure 4:
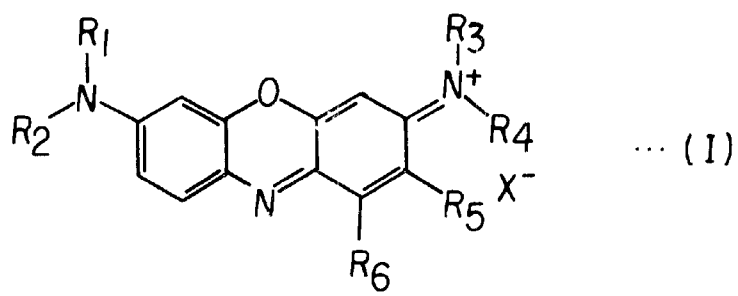

FIG. 4 describes the general formula (I) of the oxazine light absorbing dyes used in the fluorescent conversion filter according to the invention.

Figure 5:
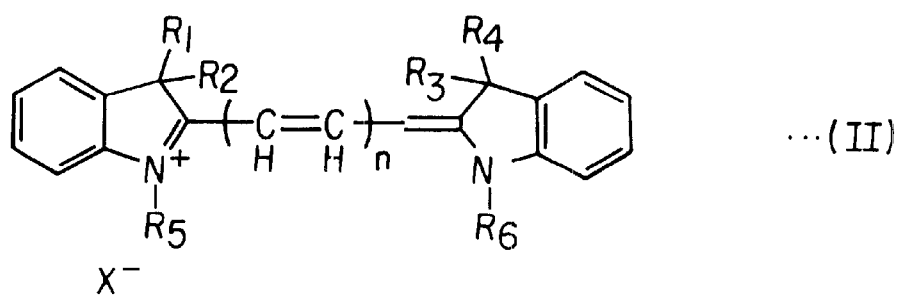

FIG. 5 describes the general formula (II) of the cyanine light absorbing dyes used in the fluorescent conversion filter according to the invention.

Figure 6:
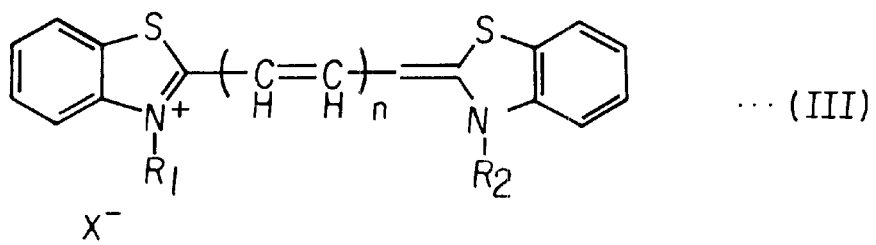

FIG. 6 describes the general formula (III) of the other cyanine light absorbing dyes used in the fluorescent conversion filter according to the invention.

Figure 7:
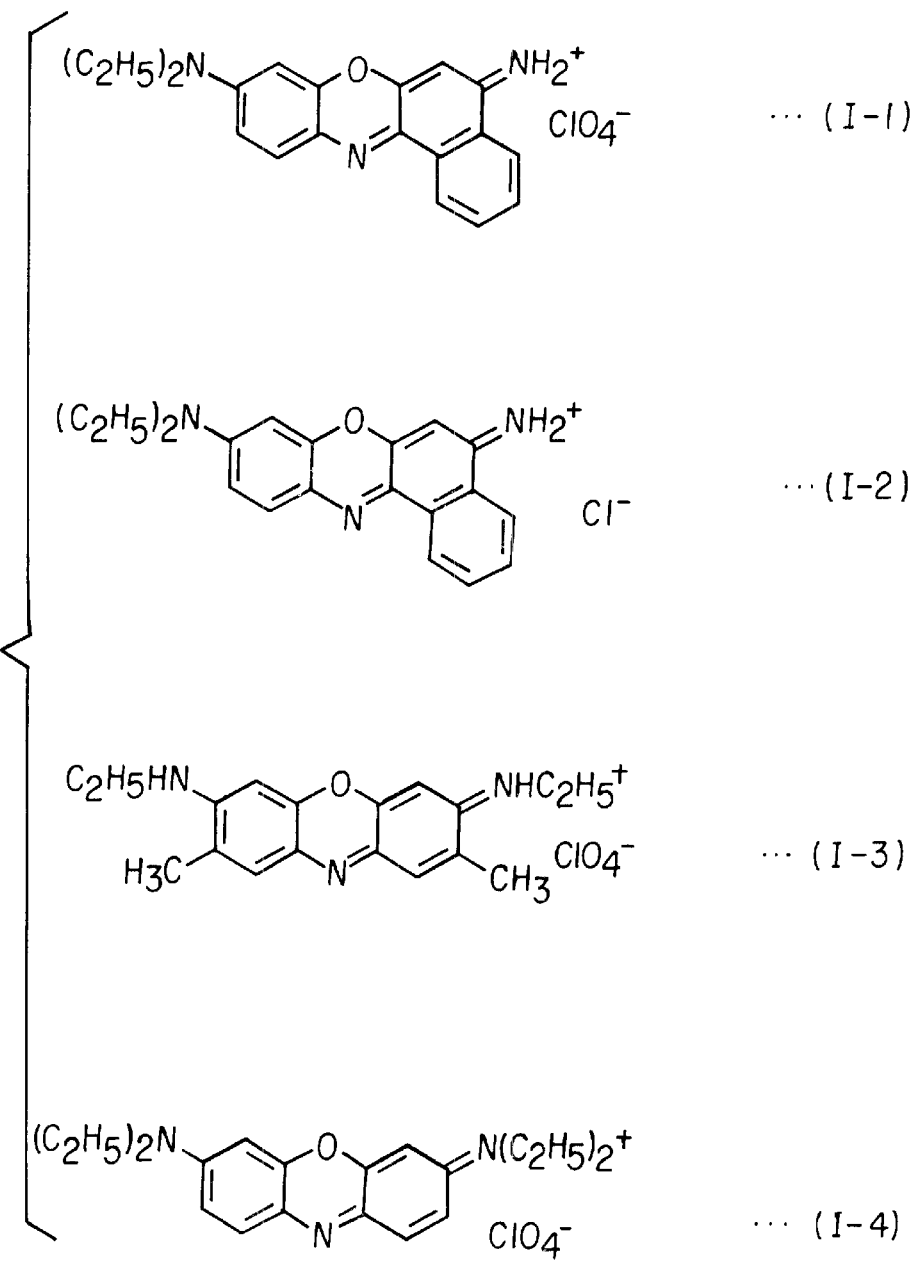

FIG. 7 describes the general formulas I-1 through I-4 of the oxazine light absorbing dyes used in the fluorescent conversion filter according to the invention.

Figure 8:
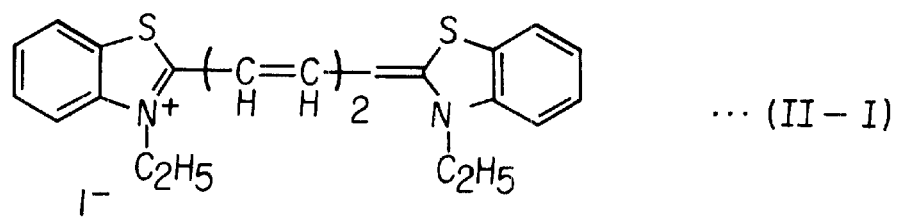

FIG. 8 describes the chemical formula II-1 of the cyanine light absorbing dye used in the fluorescent conversion filter according to the invention.

Figure 9:
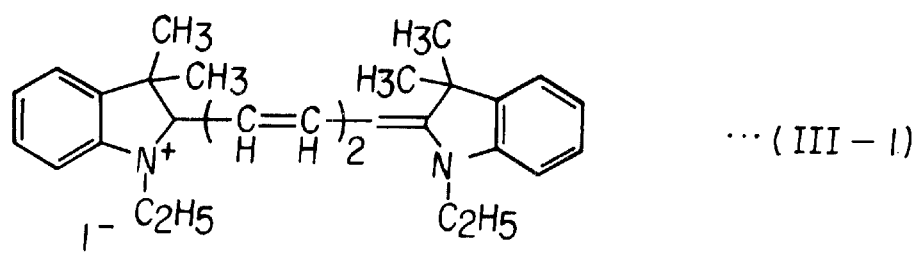

FIG. 9 describes the chemical formula III-1 of the other cyanine light absorbing dye used in the fluorescent conversion filter according to the invention.

DETAILED DESCRIPTION OF THE PREFERRED EMBODIMENTS

Now the fluorescent dyes and the fluorescent pigments used for the fluorescent conversion filter will be explained.

The fluorescent dyes, which absorb the light in the region from near-ultraviolet to blue and convert the absorbed light to the light in the green region, include the coumarin dyes such as 3-(2'-benzothiazolyl)-7-diethylamino coumarin (Coumarin 6), 3-(2'-benzoimidazolyl)-7-N,N-diethyl aminocoumarin (Coumarin 7), 3-(2'-N-methylbenzoimidazolyl)-7-N,N-diethyl aminocoumarin (Coumarin 30), and 2,3,5,6-1H,4H-tetrahydro-8-triflouro methylquinolizine(9,9a,1-gh)coumarin (Coumarin 153), the coumarin dyestuffs such as Basic yellow 51, the naphthalimide dyes such as Solvent yellow 11 and Solvent yellow 116. In addition, various dyestuffs including direct dyes, acid dyes, basic dyes and disperse dyes are used as far as they are fluorescent.

It is preferable for the fluorescent conversion filter to contain one or more fluorescent dyes or one or more fluorescent pigments which emit fluorescent light in the green region. One or more fluorescent dyes which emit fluorescent light in the green region may be combined with the one or more fluorescent pigments which emit fluorescent light in the green region. The fluorescent pigments, obtained by previously masticating the above described dyes which emit the fluorescent light in the green region in polymethacrylate, poly(vinyl chloride), vinyl chloride-vinyl acetate copolymer resin, alkyd resin, aromatic sulfonamide resin, urea resin, melamine resin, benzoguanamine resin and their appropriate mixture, are also used. The fluorescent dyes and the fluorescent pigments are used alone or in an appropriate combination.

The dye concentration in the fluorescent conversion filter or in the fluorescent conversion film is set in the range that does not cause concentration extinction nor self-absorption. Preferably, the fluorescent conversion filter or the fluorescent conversion film is less than 20 μm in thickness and its light absorbance is one or more in the wavelength region between 450 nm and 500 nm. When the light absorbance is less than one, the light from the blue light emitting element is transmitted, resulting in a low color purity.

The light absorbing dyes are used for absorbing the wavelength component in the region between 550 to 650 nm of the light from the fluorescent dyes as far as they have an absorption band in the wavelength region of longer than 550 nm. The oxazine dyes described by the foregoing general formula (I) in FIG. 4, the cyanine dyes described by the foregoing general formula (II) in FIG. 5, or the cyanine dyes described by the foregoing general formula (III) in FIG. 6 are used preferably.

The preferable oxazine dyes described by the general formula (I) include 5-amino-9-diethyliminobenzo[a]phenoxazonium-perchlorate (nile Blue A perchloride), 5-amino-9-diethyliminobenzo[a]phenoxazonium-chlorate (nile Blue A chloride), 3-ethylamino-7-ethylimino-2,8-dimethyl phenoxazine-5-ium-perchlorate, and 3-ethylamino-7-ethylimino phenoxazonium-perchlorate. These compounds are described by chemical formulas I-1 through I-4 in FIG. 7.

Figure 1:
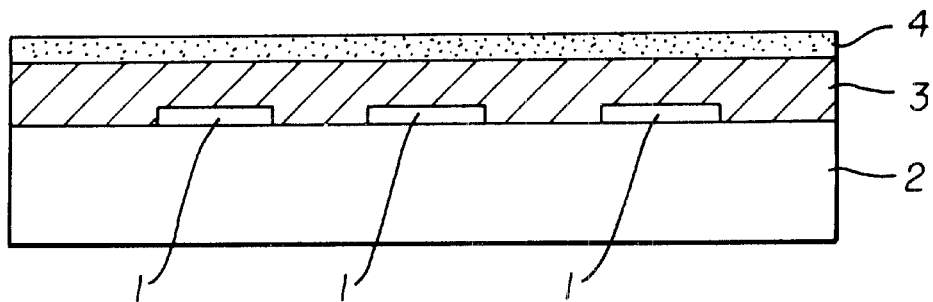
FIG. 1 is a cross sectional view of a fluorescent conversion filter according to an embodiment of the invention.

The preferable cyanine dyes described by the general formula (II) or (III) include 3-diethylthiacarbocyanine iodide described by a chemical formula II-1 in FIG. 8 and 1,1',3,3,3',3'-hexamethylindodicarbocyanine iodide described by a chemical formula III-1 in FIG. 9.

These light absorbing dyes are used alone or in an appropriate combination.

A photo-curing resin or a photo- and thermo-setting resin is used preferably as a matrix resin for binding the foregoing fluorescent converter material or for binding the foregoing light absorbing dye. The photo-curing resin or the photo- and thermo-setting resin used in the fluorescent conversion filter according to the invention is a polymerization product or a crosslinking product polymerized or crosslinked through the radicals and ions produced by an optical treatment, a thermal treatment, or a optical and thermal treatment so that the resin may be insoluble and may not melt easily. More in detail, the foregoing photo-curing resin or the foregoing photo- and thermo-setting resin is:

(1) a polymerization product of acrylic multifunctional monomers and acrylic multifunctional oligomers having acryloyl groups or methacryloyl groups, polymerized through photo-radicals or thermo-radicals produced by an optical or thermal treatment from a composition, including the acrylic multifunctional monomers, the acrylic multifunctional oligomers and an optical or thermal polymerization initiator, (2) a crosslinking product of poly (vinyl cinnamate) crosslinked by dimerizing a composition including poly (vinyl cinnamate) and a sensitizer by an optical or thermal treatment, (3) a crosslinking product of a composition, including linear or cyclic olefin and bisazido, crosslinked with olefin through nitrene produced from the composition by an optical or thermal treatment, or (4) a polymerization product of monomers having an epoxy group polymerized through the acid (cations) produced from a composition including the monomers and an optical acid generating agent by an optical or thermal treatment. Among the photo-curing resins or the photo- and thermo-setting resins, the polymerization product (1) described above is preferable, since the polymerization product (1) can be patterned very finely and exhibits high solvent resistance and high thermal resistance.

The fluorescent conversion filter according to the invention includes a mono-layered film containing a fluorescent converter material that absorbs light in the wavelength region from near-ultraviolet to blue and emits green light and a light absorbing dye that absorbs light in the wavelength region between 550 and 650 nm. The fluorescent converter material is a fluorescent dye, a fluorescent pigment or a mixture of a fluorescent dye and a fluorescent pigment. Or, the fluorescent conversion filter according to the invention includes a fluorescent conversion film that contains a fluorescent converter material and a light absorbing film that contains a light absorbing dye. The fluorescent conversion filter is formed on a transparent substrate by printing, dispersing, dying, electroplating, micell-electrolysis, and such methods.

The mixing ratios of the fluorescent converter material and the light absorbing dye are adjusted such that the light absorbance of the fluorescent conversion filter is one or more in the wavelength region between 450 and 500 nm and 0.1 or more in the wavelength region between 550 and 650 nm. When the light absorbance is less than one in the wavelength region between 450 and 500 nm, a part of the light from the light emitter in the wavelength region from near-ultraviolet to blue is not absorbed, resulting in a poor green color purity. When the light absorbance is less than 0.1 in the wavelength region between 550 and 650 nm, the more than 550 nm wavelength component of the light converted by the fluorescent converter material is outputted, resulting also in a poor green color purity.

The organic light emitting element according to the invention includes the fluorescent conversion filter described above and an organic light emitter that emits light in the wavelength region between 450 and 520 nm. The fluorescent conversion filter absorbs the light emitted from the organic light emitter in the wavelength region from near-ultraviolet to blue and outputs green light.

The organic light emitter includes an organic light emitting layer between a pair of electrodes. If necessary, a hole injection layer, an electron injection layer, and such functional layers are interposed between the electrodes. In detail, the following layer structures are employed.
(1) Anode/Organic light emitting layer/Cathode
(2) Anode/Hole injection layer/Organic light emitting layer/Cathode
(3) Anode/Organic light emitting layer/Electron injection layer/Cathode
(4) Anode/Hole injection layer/Organic light emitting layer/Electron injection layer/Cathode
(5) Anode/Hole injection layer/Hole transport layer/Organic light emitting layer/Electron injection layer/Cathode Conventional materials are used for the layers described above. Benzothiazole compounds, benzimidazole compounds, benzoxazole compounds, metal chelate oxonium compounds, styrylbenzene compounds and aromatic dimethylidyne compounds are used preferably for the organic light emitter materials which emit light in the wavelength region between 450 and 520 nm.

Figure 2:
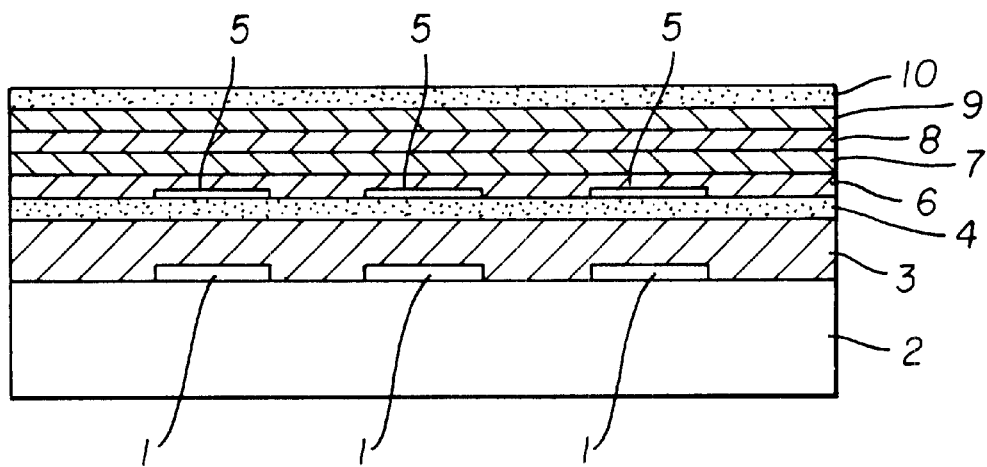
FIG. 2 is a cross sectional view of an organic light emitting element that uses the fluorescent conversion filter of FIG. 1.

FIG. 1 is a cross sectional view of a fluorescent conversion filter according to an embodiment of the invention. FIG. 2 is a cross sectional view of an organic light emitting element that uses the fluorescent conversion filter of FIG. 1.

Referring now to FIG. 1, a fluorescent conversion filter includes a transparent glass substrate 2, fluorescent conversion filter layers 1 on the transparent substrate 2, a protection layer 3 covering the fluorescent conversion filter layers 1, and an insulative inorganic oxide layer 4 covering the protection layer 3. The fluorescent conversion filter layers 1 exhibit the properties as described above.

Referring now to FIG. 2, the organic light emitting element includes an organic light emitter film formed on the fluorescent conversion filter. The organic light emitter film includes a transparent anode 5, that is a patterned ITO film, on the insulative inorganic oxide layer 4, a hole injection layer 6 covering the transparent anode 5, a hole transport layer 7 on the hole injection layer 6, an organic light emitting layer 8 on the hole transport layer 7, an electron injection layer 9 on the organic light emitting layer 8, and a cathode 10, that is a patterned metal electrode, on the electron injection layer 9. The anode 5 is shaped with stripes extending in parallel to each other and the cathode 10 is shaped with stripes extending in parallel to each other. The anode stripes and the cathode stripes cross each other.

When a voltage is applied between a specific stripe of the anode 5 and a specific stripe of the cathode 10, the portion of the organic light emitting layer 8 in a specific location where the specific anode stripe and the specific cathode stripe cross each other emits light in the wavelength region between 450 and 520 nm. The light emitted from the organic light emitting layer 8 is efficiently converted by the fluorescent conversion filter layer 1 on the specific location to green light in the wavelength region between 500 and 550 nm. The converted green light with a high color purity is outputted through the transparent substrate 2.

First Embodiment (E1)
(Fabrication of a Fluorescent Conversion Filter)

As shown in FIG. 1, a transparent photo-polymerizing resin (SP-2600 supplied from Showa Highpolymer Co., Ltd.), containing Coumarin 6 as a fluorescent converter dye and the compound described by the foregoing chemical formula I-1 (nile Blue A perchloride) as a light absorbing dye, is spin-coated on a glass substrate 2 (143×112×1.1 mm$^3$, supplied from CORNING INC.). The coated photopolymerizing resin layer is dried in an oven, resulting in a fluorescent conversion film.

Then, the fluorescent conversion film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained fluorescent converter stripes in an oven, a fluorescent conversion filter 1 of 6 μm in thickness is obtained.

Figure 3:
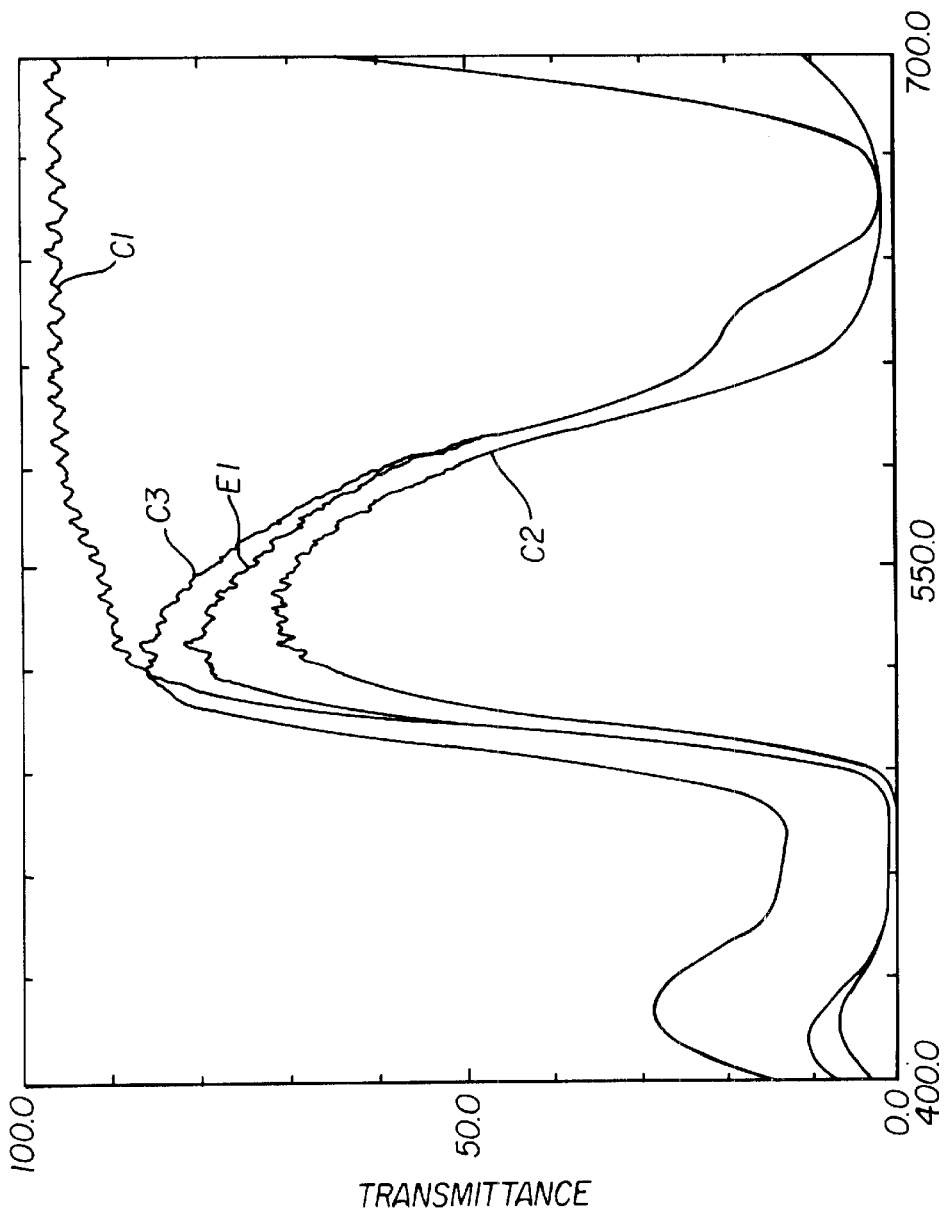
FIG. 3 is a graph comparing the absorption curves of the fluorescent conversion filters according to the first embodiment and the comparative examples of the invention.

The dye concentrations in the fluorescent conversion filter are adjusted such that the light absorbance of the fluorescent conversion filter at the thickness of 6 μm is one or more in the wavelength region between 450 nm and 500 nm and 0.1 or more in the wavelength region between 550 and 650 nm as shown in FIG. 3.

A protection layer 3 is formed on the fluorescent conversion filter 1 by spin-coating a UV-curing resin (epoxymodified acrylate) and by irradiating the light from a high pressure mercury lamp to the coated UV-curing resin. The thickness of the protection layer 3 is 3 μm. An insulative inorganic oxide layer 4 is formed on the protection layer 3 by sputtering $SiO_2$.

An organic light emitting element is fabricated by forming an organic light emitter film consisting of six layers, which are an anode 5, a hole injection layer 6, a hole transport layer 7, an organic light emitting layer 8, an electron injection layer 9 and a cathode 10, on the fluorescent conversion filter formed as described above.

At first, a transparent electrode (hereinafter sometimes referred to as an "ITO") is deposited on the entire upper surface of the outermost insulative inorganic oxide layer 4 of the fluorescent conversion filter. A photoresist agent (OFRP-800 supplied from Tokyo Ohka Kogyo Co., Ltd.) is coated on the ITO and patterned by photolithography. The anode 5 with a stripe pattern of the ITO consisting of stripes, 0.33 mm in width, 100 nm in thickness and spaced apart for 0.07 mm, is obtained.

Then, the laminate, including the substrate 2, the fluorescent conversion filter and the transparent electrode, is loaded into a resistance heating vacuum deposition chamber, and a hole injection layer 6, a hole transport layer 7, a light emitting layer 8 and an electron injection layer 9 are deposited one by one without breaking the vacuum. Table 1 lists the structural formula of the materials used for these organic layers. A copper phthalocyanine (CuPc) layer of 100 nm in thickness is deposited for the hole injection layer 6. A 4,4'-bis[N-(1-naphthyl)-N-phenylamino]biphenyl (α-NPD) layer of 20 nm in thickness is deposited for the hole transport layer 7. A 4,4'-bis(2,2'-diphenylvinyl)biphenyl (DPVBi) layer of 30 nm in thickness is deposited for the light emitting layer 8. And, a tris(8-hydroxyquinoline) aluminum complex (Alq) layer of 20 nm in thickness is deposited for the electron injection layer 9.

TABLE 1

| Layers | Materials | Structural formulas |
| --- | --- | --- |
| Hole injection layer | CuPc | 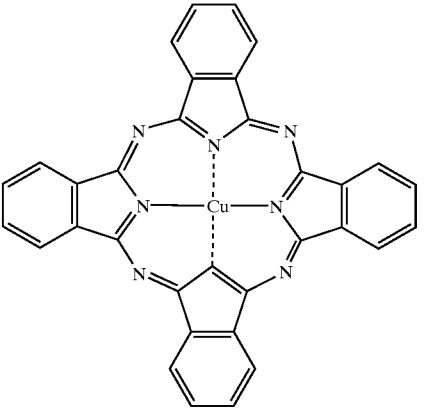 |
| Hole transport layer | α-NPD | 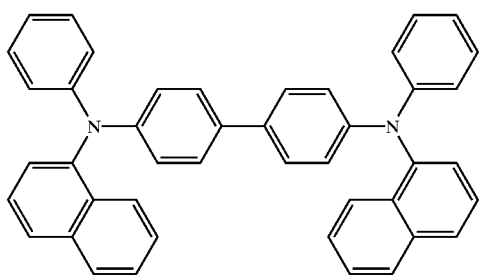 |
| Light emitting layer | DPVBi | 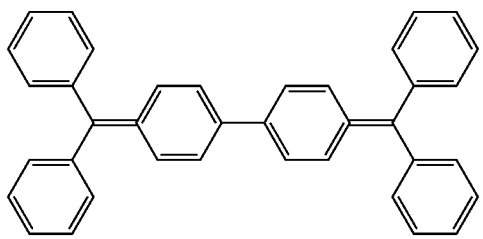 |
| Electron injection layer | Alq | 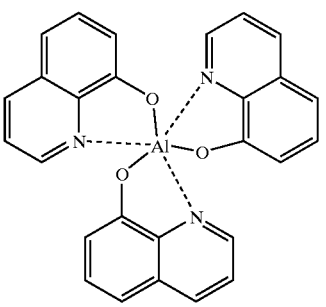 |

Then, the substrate 2 with the fluorescent conversion filter and the organic layers deposited thereon is taken out from the vacuum deposition chamber and a mask for obtaining the stripe pattern consisting of stripes, 0.33 mm in width and spaced apart for 0.07 mm, is positioned perpendicularly to the ITO stripes of the anode 5. The laminate with the mask positioned thereon is loaded again into the resistance heating vacuum deposition chamber and a Mg/Ag (10:1 in weight ratio) layer of 200 nm in thickness is deposited for the cathode 10.

The organic light emitting element including the fluorescent conversion filter and the organic light emitter film is sealed with a sealant glass and a UV-curing adhesive in a dry nitrogen atmosphere in a glove box.

Second Embodiment (E2)

A fluorescent conversion film is formed by spin-coating a transparent photo-polymerizing resin (SP-1509 supplied from Showa Highpolymer Co., Ltd.) containing Coumarin 6 as a fluorescent converter dye and the compound described by the foregoing chemical formula I-2 (nile Blue A perchloride) as a light absorbing dye on a glass substrate and by drying the coated photo-polymerizing resin in an oven.

Then, the fluorescent conversion film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained laminate in an oven, a fluorescent conversion filter 1 of 6 μm in thickness is obtained.

The dye concentrations in the fluorescent conversion filter are adjusted such that the light absorbance of the fluorescent conversion filter at the thickness of 6 μm is 1 or more in the wavelength region between 450 nm and 500 nm and 0.1 or more in the wavelength region between 550 and 650 nm.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

Third Embodiment (E3)

A fluorescent conversion film is formed by spin-coating a transparent photo-polymerizing resin (V-2400PET Series supplied from Nippon Steel Chemical Co., Ltd.) containing Coumarin 6 as a fluorescent converter dye and the compound described by the foregoing chemical formula I-3 (3-ethylamino-7-ethylimino-2,8-dimethylphenoxazine-5-ium-perchlorate) as a light absorbing dye on a glass substrate and by drying the coated photo-polymerizing resin in an oven.

Then, the fluorescent conversion film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained laminate in an oven, a fluorescent conversion filter 1 of 6 μm in thickness is obtained.

The dye concentrations in the fluorescent conversion filter are adjusted such that the light absorbance of the fluorescent conversion filter at the thickness of 6 μm is one or more in the wavelength region between 450 nm and 500 nm and 0.1 or more in the wavelength region between 550 and 650 nm.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

Fourth Embodiment (E4)

In the similar way as in the first embodiment, a fluorescent conversion film is formed by spin-coating a transparent photo-polymerizing resin (V-240OPET Series supplied from Nippon Steel Chemical Co., Ltd.) containing Coumarin 6 as a fluorescent converter dye and the compound described by the foregoing chemical formula I-4 (3-ethylamino-7-diethylimino phenoxazonium-perchlorate) as a light absorbing dye on a glass substrate and by drying the coated photo-polymerizing resin in an oven.

Then, the fluorescent conversion film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained laminate in an oven, a fluorescent conversion filter 1 of 6 μm in thickness is obtained.

The dye concentrations in the fluorescent conversion filter are adjusted such that the light absorbance of the fluorescent conversion filter at the thickness of 6 μm is one or more in the wavelength region between 450 nm and 500 nm and 0.1 or more in the wavelength region between 550 and 650 nm.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

Fifth Embodiment (E5)

A transparent photo-polymerizing resin (V-240OPET Series supplied from Nippon Steel Chemical Co., Ltd.) containing the compound described by the foregoing chemical formula II-1 (3-diethylcarbocyanine iodide) as a light absorbing dye is spin-coated on a glass substrate. Then, the coated resin film is patterned by the contact exposure technique that exposes the light from a high pressure mercury lamp to the coated resin film through a mask for obtaining a stripe pattern consisting of stripes, 0.33 mm in width and spaced apart for 1.2 mm, and by developing the exposed stripe pattern with alkaline aqueous solution. Then, by drying the obtained resin film stripes in an oven, a stripe pattern of a light absorption film, 1 μm in thickness, is obtained.

Then, a transparent photo-polymerizing resin (V-2400PET Series supplied from Nippon Steel Chemical Co., Ltd.) containing Coumarin 6 as a fluorescent converter dye is spin-coated on the light absorption film. Then, the coated resin film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained resin film stripes in an oven, a stripe pattern of a fluorescent conversion film, 6 μm in thickness, is formed on the light absorption film of 1 μm in thickness. Thus, a laminated fluorescent conversion filter of 7 μm in thickness is obtained.

The dye concentrations in the fluorescent conversion filter are adjusted such that the light absorbance of the fluorescent conversion filter is 1 or more in the wavelength region between 450 nm and 500 nm and 0.1 or more in the wavelength region between 550 and 650 nm.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

Sixth Embodiment (E6)

A transparent photo-polymerizing resin (V-2400PET Series supplied from Nippon Steel Chemical Co., Ltd.) containing the compound described by the foregoing chemical formula III-1 (1,1',3,3,3',3'-hexamethylindo dicarbocyanine iodide) as a light absorbing dye is spin-coated on a glass substrate. Then, the coated resin film is patterned by the contact exposure technique that exposes the light from a high pressure mercury lamp to the coated resin film through a mask for obtaining a stripe pattern consisting of stripes, 0.33 mm in width and spaced apart for 1.2 mm, and by developing the exposed stripe pattern with alkaline aqueous solution. Then, by drying the obtained resin film stripes in an oven, a stripe pattern of a light absorption film, 1 µm in thickness, is obtained.

Then, a transparent photo-polymerizing resin (V-2400PET Series supplied from Nippon Steel Chemical Co., Ltd.) containing Coumarin 153 as a fluorescent converter dye is spin-coated on the light absorption film. Then, the coated resin film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained resin film stripes in an oven, a stripe pattern of a fluorescent conversion film, 6 µm in thickness, is formed on the light absorption film of 1 µm in thickness. Thus, a laminated fluorescent conversion filter of 7 µm in thickness is obtained.

The dye concentrations in the fluorescent conversion filter are adjusted such that the light absorbance of the fluorescent conversion filter is one or more in the wavelength region between 450 nm and 500 nm and 0.1 or more in the wavelength region between 550 and 650 nm.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

COMPARATIVE EXAMPLE 1 (C1)

A fluorescent conversion film is formed on a transparent glass substrate (143×112×1.1 mm$^3$, supplied from CORNING INC.) by spin-coating a transparent photo-polymerizing resin (SP-2600 supplied from Showa Highpolymer Co., Ltd.) containing Coumarin 6 as a fluorescent converter dye and by drying the coated photo-polymerizing resin in an oven.

Then, the fluorescent conversion film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained fluorescent conversion film in an oven, a fluorescent conversion filter of 6 µm in thickness is obtained.

The dye concentration in the fluorescent conversion filter is adjusted such that the light absorbance of the fluorescent conversion filter at the thickness of 6 µm is one or more in the wavelength region between 450 nm and 500 nm. However, the light absorbance of the fluorescent conversion filter at the thickness of 6 µm is less than 0.1 in the wavelength region between 550 and 650 nm.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

COMPARATIVE EXAMPLE 2 (C2)

A green filter material (Color Mosaic CG-7001 supplied from FUJIFILM OLIN CO., LTD..) is coated by spin-coating on a transparent glass substrate (143×112×1.1 mm$^3$, supplied from CORNING INC.) and the coated filter material layer is patterned by the photolithographic method, resulting in a green filter layer (light absorption film) consisting of stripes, 0.1 µm in thickness, 0.33 mm in width and spaced apart for 1.2 mm. The green filter layer, the light absorbance thereof is 0.1 or more in the wavelength region between 500 nm and 650 nm, absorbs the light from the fluorescent conversion filter.

A fluorescent conversion film is formed on the green filter layer by spin-coating a transparent photo-polymerizing resin (SP-2600 supplied from Showa Highpolymer Co., Ltd.) containing Coumarin 6 as a fluorescent converter dye and by drying the coated photo-polymerizing resin in an oven at 80° C. Then, the fluorescent conversion film is patterned by the contact exposure technique that exposes the light from a high pressure mercury lamp to the fluorescent conversion film through a mask for obtaining a stripe pattern consisting of stripes, 0.33 mm in width and spaced apart for 1.2 mm, and by developing the exposed stripe pattern with alkaline aqueous solution. Then, by drying the obtained laminate in an oven, a fluorescent conversion filter of 7 µm in thickness, consisting of the light absorption film of 1.0 µm in thickness and the fluorescent conversion film of 6 µm in thickness, is obtained.

The dye concentration in the fluorescent conversion filter is adjusted such that the light absorbance of the fluorescent conversion filter at the thickness of 6 µm is one or more in the wavelength region between 450 nm and 500 nm as shown in FIG. 3.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

COMPARATIVE EXAMPLE 3 (C3)

A transparent photo-polymerizing resin (SP-1509 supplied from Showa Highpolymer Co., Ltd.) containing Coumarin 6 as a fluorescent converter dye and the compound described by the foregoing chemical formula I-1 (nile Blue A perchloride) as a light absorbing dye is spin-coated on a transparent glass substrate and the coated photo-polymerizing resin layer is dried in an oven. Then, the dried photo-polymerizing resin layer is patterned by the contact exposure technique that exposes the light from a high pressure mercury lamp to the photo-polymerizing resin layer through a mask for obtaining a stripe pattern consisting of stripes, 0.33 mm in width and spaced apart for 1.2 mm, and by developing the exposed stripe pattern with alkaline aqueous solution. Then, by drying the developed resin layer stripes in an oven, a fluorescent conversion filter of 6 µm in thickness is obtained.

The dye concentrations in the fluorescent conversion filter are adjusted such that the absorbance of the fluorescent conversion film at the film thickness of 6 µm is more than 0.1 in the wavelength region between 550 and 650 nm and 0.8 in the wavelength region between 450 nm and 500 nm.

In the same way as in the first embodiment, an organic light emitting element is fabricated by forming a protection layer 3, an insulative inorganic oxide layer 4 and an organic light emitter film including an anode 5, a hole injection layer 6, a hole transport layer 7, an organic light emitting layer 8, an electron injection layer 9 and a cathode 10 on the fluorescent conversion filter. The obtained organic light emitting element is sealed with a sealant glass.

Evaluation

Table 2 lists the evaluation results of the fluorescent conversion filters according to the first through sixth embodiments and the comparative examples 1 through 3. The evaluation items and the evaluation methods will be described below.

(Film Thickness)

The step heights from the glass substrate surface of the fluorescent conversion filters are measured with a surface roughness meter (DEKTAK IIA supplied from ULVAC JAPAN Ltd.).

(CIE Chromaticity Coordinates)

The CIE chromaticity coordinates are measured with a photometer (MCPD-1000 supplied from Otsuka Electronics Co., Ltd.).

(Relative Conversion Efficiency)

A reference voltage is defined as the voltage at that the luminance of the light emitted from the organic light emitting element through the fluorescent conversion filter of the first embodiment is 50 cd/m$^2$. The relative conversion efficiencies are evaluated by comparing the luminance values measured by applying the reference voltage to the organic light emitting elements on the respective fluorescent conversion filters with the luminance, i.e. 50 cd/m$^2$, of the organic light emitting element according to the first embodiment.

TABLE 2

|  | Film thickness | CIE chromaticity coordinates | | Relative conversion efficiencies |
| --- | --- | --- | --- | --- |
|  |  | x | y |  |
| E 1 | 6 μm | 0.21 | 0.65 | 1 |
| E 2 | 6 μm | 0.21 | 0.67 | 0.98 |
| E 3 | 6 μm | 0.21 | 0.69 | 0.96 |
| E 4 | 6 μm | 0.22 | 0.66 | 1.06 |
| E 5 | 7 μm | 0.22 | 0.68 | 1 |
| E 6 | 7 μm | 0.22 | 0.66 | 1.02 |
| C 1 | 6 μm | 0.24 | 0.63 | 1.2 |
| C 2 | 7 μm | 0.22 | 0.68 | 0.82 |
| C 3 | 6 μm | 0.22 | 0.55 | 1.18 |

As listed in Table 2, the organic light emitting element including any of the fluorescent conversion filters according to the first through sixth embodiments emits green light with a high color purity and is a very fine and very practical display device.

The color purity of the green light emitted from the organic light emitting element including the fluorescent conversion filter according to the comparative example one is low, since the fluorescent conversion filter emits light in the wavelength region between 550 and 650 nm.

The organic light emitting element including the fluorescent conversion filter according to the comparative example 2 includes a color filter layer to improve the green color purity. However, due to the lamination of the color filter layer, organic light emitting element according to the comparative example 2 is manufactured through increased steps. Moreover, since the color filter layer has an absorption band in the wavelength region between 500 and 550 nm, the conversion efficiency is impaired.

Since the organic light emitting element including the fluorescent conversion filter according to the comparative example 3 fails to completely absorb the blue back light, the organic light emitting element including the fluorescent conversion filter according to the comparative example 3 emits bluish green light.

As explained above, the fluorescent conversion filter according to the invention, that interrupts the leakage light from the light emitter in the wavelength region between 450 and 500 nm and the more than 550 nm component of the light emitted from the fluorescent converter material, facilitates selectively emitting light in the wavelength region between 500 and 550 nm and outputting green light with a high color purity. The mono-layered fluorescent conversion filter according to the invention, that contains a fluorescent converter material and a light absorbing dye in one layer, facilitates simplifying the manufacturing process. Therefore, the fluorescent conversion filter according to the invention and the organic light emitting element including the fluorescent conversion filter according to the invention are preferably employable in display devices for civil or industrial use such as a light-emitting-type multicolor display, a light-emitting-type full-color display, a display panel and a back light.

What is claimed is:

1. A fluorescent conversion filter comprising:

a fluorescent converter material selected from the group consisting of a fluorescent dye, a fluorescent pigment, and a mixture of a fluorescent dye and a fluorescent pigment;

a light absorbing dye; and a matrix resin;

said fluorescent converter material absorbing the light from a light emitter, said light being in a wavelength region between near-ultraviolet and blue;

said fluorescent converter material emitting green light;

said fluorescent converter material having an absorption band in a wavelength region between 450 and 500 nm;

said fluorescent converter material being contained in said fluorescent conversion filter at a mixing ratio, thereat the light absorbance of said fluorescent conversion filter is one or more in said wavelength region between 450 and 500 nm;

said light absorbing dye having an absorption band in a wavelength region of 550 nm or longer;

said light absorbing dye being contained in said fluorescent conversion filter at a mixing ratio, thereat the light absorbance of said fluorescent conversion filter is 0.1 or more in a wavelength region between 550 and 650 nm.

2. A fluorescent conversion filter comprising:

a fluorescent conversion film; and a light absorption film laminated on said fluorescent conversion film;

said fluorescent conversion film comprising a matrix resin and a fluorescent converter material selected from the group consisting of a fluorescent dye, a fluorescent pigment and a mixture of a fluorescent dye and a fluorescent pigment;

said fluorescent converter material absorbing the light from a light emitter, said light being in a wavelength region between near-ultraviolet and blue;

said fluorescent converter material emitting green light;

said fluorescent converter material having an absorption band in a wavelength region between 450 and 500 nm;

said fluorescent converter material being contained in said fluorescent conversion film at a mixing ratio, thereat the light absorbance of said fluorescent conversion filter is one or more in said wavelength region between 450 and 500 nm;

said light absorption film comprising a light absorbing dye and said matrix resin;

said light absorbing dye having an absorption band in a wavelength region of 550 nm or longer;

said light absorbing dye being contained in said light absorption film at a mixing ratio, thereat the light absorbance of said fluorescent conversion filter is 0.1 or more in a wavelength region between 550 and 650 nm.

3. The fluorescent conversion filter according to claim 1, wherein said light absorbing dye comprises an oxazine dye described by the following general formula (I),

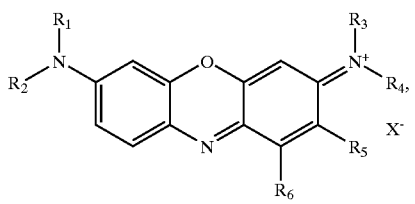

(I)

wherein said $R_1$ is a hydrogen atom, an alkyl group, an aryl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_1$, said $R_2$, said $R_3$ and said $R_4$ are same with or different from each other; said $R_5$ is a hydrogen atom or a benzene ring; said $R_6$ is a hydrogen atom or a benzene ring; and said $X^-$ is an anion selected from the group consisting of $I^-$, $Br^-$, $ClO_4^-$, $BF_4^-$, $PF_4^-$, and $SbF_4^{-31}$.

4. The fluorescent conversion filter according to claim 2, wherein said light absorbing dye comprises an oxazine dye described by the following general formula (I),

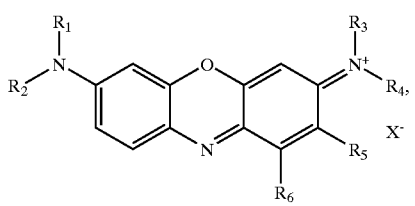

(I)

wherein said $R_1$ is a hydrogen atom, an alkyl group, an aryl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_1$, said $R_2$, said $R_3$ and said $R_4$ are same with or different from each other; said $R_5$ is a hydrogen atom or a benzene ring; said $R_6$ is a hydrogen atom or a benzene ring; and said $X^-$ is an anion selected from the group consisting of $I^-$, $Br^-$, $ClO_4^-$, $BF_4^-$, $PF_4^-$, and $SbF_4^-$.

5. The fluorescent conversion filter according to claim 1, wherein said light absorbing dye comprises a cyanine dye described by the following general formula (II),

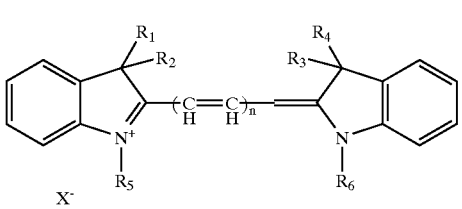

(II)

wherein said $R_1$ is a hydrogen atom, an alkyl group, an alkyl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_5$ is a hydrogen atom, an alkyl group, an aryl group or a heterocyclic group; said $R_6$ is a hydrogen atom, an alkyl group, an aryl group or a heterocyclic group; said $R_1$, said $R_2$, said $R_3$, said $R_4$, said $R_5$ and said $R_6$ are same with or different from each other; and said $X^-$ is an anion selected from the group consisting of $I^-$, $Br^-$, $ClO_4^-$, $BF_4^-$, $PF_4^-$, $SbF_4^-$, and $1/2$ $(SO_4^{2-})$.

6. The fluorescent conversion filter according to claim 2, wherein said light absorbing dye comprises a cyanine dye described by the following general formula (II), (II)

wherein said $R_1$ is a hydrogen atom, an alkyl group, an aryl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_5$ is a hydrogen atom, an alkyl group, an aryl group or a heterocyclic group; said $R_6$ is a hydrogen atom, an alkyl group, an aryl group or a heterocyclic group; said $R_1$, said $R_2$, said $R_3$, said $R_4$, said $R_5$ and said $R_6$ are same with or different from each other; and said $X^-$ is an anion selected from the group consisting of $I^-$, $Br^-$, $ClO_4^-$, $BF_4^-$, $PF_4^-$, $SbF_4^-$, and $1/2$ $(SO_4^{2-})$.

7. The fluorescent conversion filter according to claim 1, wherein said light absorbing dye comprises a cyanine dye described by the following general formula (III), (III)

wherein said $R_1$ is a hydrogen atom, an alkyl group, an aryl group or a heterocyclic group; said $R_2$ is a hydrogen atom, an alkyl group, an aryl group or a heterocyclic group; said $R_1$, and said $R_2$ are same with or different from each other; and said $X^-$ is an anion selected from the group consisting of $I^-$, $Br^-$, $ClO_4^-$, $BF_4^-$, $PF_4^-$, $SbF_4^-$, and $1/2(SO_4^{2-})$.

8. The fluorescent conversion filter according to claim 2, wherein said light absorbing dye comprises a cyanine dye described by the following general formula (III),

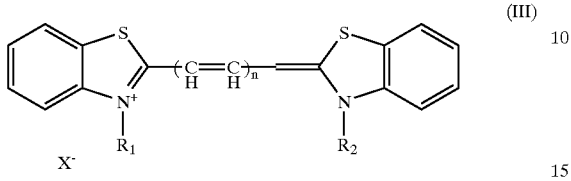

(III)

wherein said $R_1$ is a hydrogen atom, an alkyl group, an aryl group or a heterocyclic group; said $R_2$ is a hydrogen atom, an alkyl group, an aryl group or a heterocyclic group; said $R_1$ and said $R_2$ are same with or different from each other; and said $X^-$ is an anion selected from the group consisting of $I^-$, $Br^-$, $ClO_4^-$, $BF_4^-$, $PF_4^-$, $SbF_4^-$, and $1/2(SO_4^{2-})$.

9. The fluorescent conversion filter according to claim 1, wherein said matrix resin comprises a photo-curing resin.

10. The fluorescent conversion filter according to claim 2, wherein said matrix resin comprises a photo-curing resin.

11. The fluorescent conversion filter according to claim 1, wherein said matrix resin comprises a photo- and thermo-setting resin.

12. The fluorescent conversion filter according to claim 2, wherein said matrix resin comprises a photo- and thermo-setting resin.

13. An organic light emitting element comprising:
a fluorescent conversion filter; and
an organic light emitter;
said organic light emitter emitting light in a wavelength region between 450 and 520 nm;
said fluorescent conversion filter comprising a fluorescent converter material selected from the group consisting of a fluorescent dye, a fluorescent pigment and a mixture of a fluorescent dye and a fluorescent pigment, a light absorbing dye; and a matrix resin;
said fluorescent converter material absorbing said light from said light emitter; said fluorescent converter material emitting green light; said fluorescent converter material having an absorption band in a wavelength region between 450 and 500 nm; said fluorescent converter material being contained in said fluorescent conversion filter at a mixing ratio, thereat the light absorbance of said fluorescent conversion filter is 1 or more in said wavelength region between 450 and 500 nm; said light absorbing dye having an absorption band in a wavelength region of 550 nm or longer;
said light absorbing dye being contained in said fluorescent conversion filter at a mixing ratio, thereat the light absorbance of said fluorescent conversion filter is 0.1 or more in a wavelength region between 550 and 650 nm.

14. An organic light emitting element comprising:
a fluorescent conversion filter; and
an organic light emitter;
said organic light emitter emitting light in a wavelength region between 450 and 520 nm;
said fluorescent conversion filter comprising a fluorescent conversion film; and a light absorption film laminated on said fluorescent conversion film;

said fluorescent conversion film comprising a matrix resin and a fluorescent converter material selected from the group consisting of a fluorescent dye, a fluorescent pigment and a mixture of a fluorescent dye and a fluorescent pigment;
said fluorescent converter material absorbing said light from said light emitter; said fluorescent converter material emitting green light; said fluorescent converter material having an absorption band in a wavelength region between 450 and 500 nm; said fluorescent converter material being contained in said fluorescent conversion film at a mixing ratio, thereat the light absorbance of said fluorescent conversion filter is one or more in said wavelength region between 450 and 500 nm;
said light absorption film comprising a light absorbing dye and said matrix resin; said light absorbing dye having an absorption band in a wavelength region of 550 nm or longer; said light absorbing dye being contained in said light absorption film at a mixing ratio, thereat the light absorbance of said fluorescent conversion filter is 0.1 or more in a wavelength region between 550 and 650 nm.

15. The organic light emitting element according to claim 13, wherein said light absorbing dye comprises an oxazine dye described by the following general formula (I),

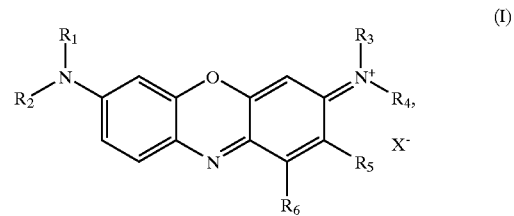

(I)

wherein said $R_1$ is a hydrogen atom, an alkyl group, an aryl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_1$, said $R_2$, said $R_3$ and said $R_4$ are same with or different from each other; said $R_5$ is a hydrogen atom or a benzene ring; said $R_6$ is a hydrogen atom or a benzene ring; and said $X^-$ is an anion selected from the group consisting of $I^-$, $Br^-$, $ClO_4^-$, $BF_4^-$, $PF_4^-$, and $SbF_4^-$.

16. The organic light emitting element according to claim 14, wherein said light absorbing dye comprises an oxazine dye described by the following general formula (I),

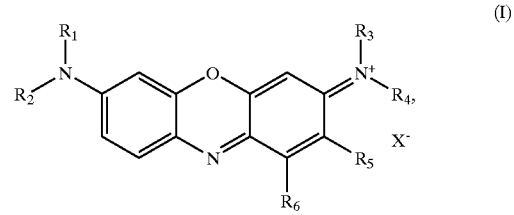

(I)

wherein said $R_1$ is a hydrogen atom, an alkyl group, an aryl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_1$, said $R_2$, said $R_3$ and said $R_4$ are same with or different from each other; said $R_5$ is a hydrogen atom or a benzene ring; said $R_6$ is a hydrogen atom or a benzene ring; and said $X^-$ is an anion selected from the group consisting of $I^-$, $Br^-$, $ClO_4^-$, $BF_4^-$, $PF_4^-$, and $SbF_4^-$.

17. The organic light emitting element according to claim 13, wherein said light absorbing dye comprises a cyanine dye described by the following general formula (II),

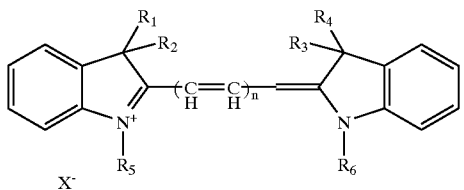

(II)

wherein said $R_1$ is a hydrogen atom, an alkyl group, an aryl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_5$ is a hydrogen atom, an alkyl group, an aryl group or a heterocyclic group; said $R_6$ is a hydrogen atom, an alkyl group, an aryl group or a heterocyclic group; said $R_1$, said $R_2$, said $R_3$, said $R_4$, said $R_5$ and said $R_6$ are same with or different from each other; and said $X^-$ is an anion selected from the group consisting of $I^-$, $Br^-$, $ClO_4^-$, $BF_4^-$, $PF_4^-$, $SbF_4^-$, and $1/2(SO_4^{2-})$.

18. The organic light emitting element according to claim 14, wherein said light absorbing dye comprises a cyanine dye described by the following general formula (II),

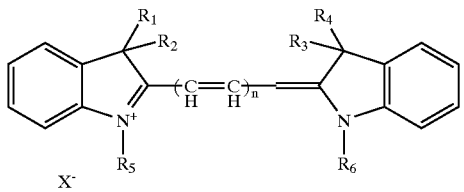

(II)

wherein said $R_1$ is a hydrogen atom, an alkyl group, an aryl group or a heterocyclic group; said $R_2$ is a hydrogen atom, an alkyl group, an aryl group or a heterocyclic group; said $R_3$ is a hydrogen atom, an alkyl group, an aryl group or a heterocyclic group; said $R_4$ is a hydrogen atom, an alkyl group, an aryl group or a heterocyclic group; said $R_5$ is a hydrogen atom, an alkyl group, an aryl group or a heterocyclic group; said $R_6$ is a hydrogen atom, an alkyl group, an aryl group or a heterocyclic group; said $R_1$, said $R_2$, said $R_3$, said $R_4$, said $R_5$ and said $R_6$ are same with or different from each other; and said $X^-$ is an anion selected from the group consisting of $I^-$, $Br^-$, $ClO_4^-$, $BF_4^-$, $PF_4^-$, $SbF_4^-$, and $1/2(SO_4^{2-})$.

19. The organic light emitting element according to claim 13, wherein said light absorbing dye comprises a cyanine dye described by the following general formula (III),

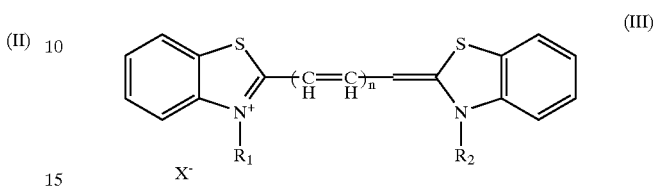

(III)

wherein said $R_1$ is a hydrogen atom, an alkyl group, an aryl group or a heterocyclic group; said $R_2$ is a hydrogen atom, an alkyl group, an aryl group or a heterocyclic group; said $R_1$, and said $R_2$ are same with or different from each other; and said $X^-$ is an anion selected from the group consisting of $I^-$, $Br^-$, $ClO_4^-$, $BF_4^-$, $PF_4^-$, $SbF_4^-$, and $1/2(SO_4^{2-})$.

20. The organic light emitting element according to claim 14, wherein said light absorbing dye comprises a cyanine dye described by the following general formula (III),

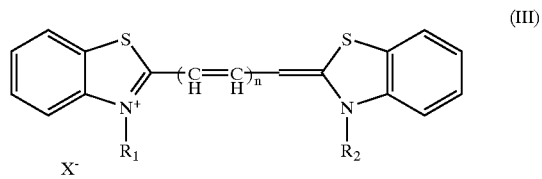

(III)

wherein said $R_1$ is a hydrogen atom, an alkyl group, an aryl group or a heterocyclic group; said $R_2$ is a hydrogen atom, an alkyl group, an aryl group or a heterocyclic group; said $R_1$ and said $R_2$ are same with or different from each other; and said $X^-$ is an anion selected from the group consisting of $I^-$, $Br^-$, $ClO_4^-$, $BF_4^-$, $PF_4^-$, $SbF_4^-$, and $1/2(SO_4^{2-})$.

21. The organic light emitting element according to claim 13, wherein said matrix resin comprises a photo-curing resin.

22. The organic light emitting element according to claim 14, wherein said matrix resin comprises a photo-curing resin.

23. The organic light emitting element according to claim 13, wherein said matrix resin comprises a photo- and thermo-setting resin.

24. The organic light emitting element according to claim 14, wherein said matrix resin comprises a photo- and thermo-setting resin.

* * * * *